Figure 1:
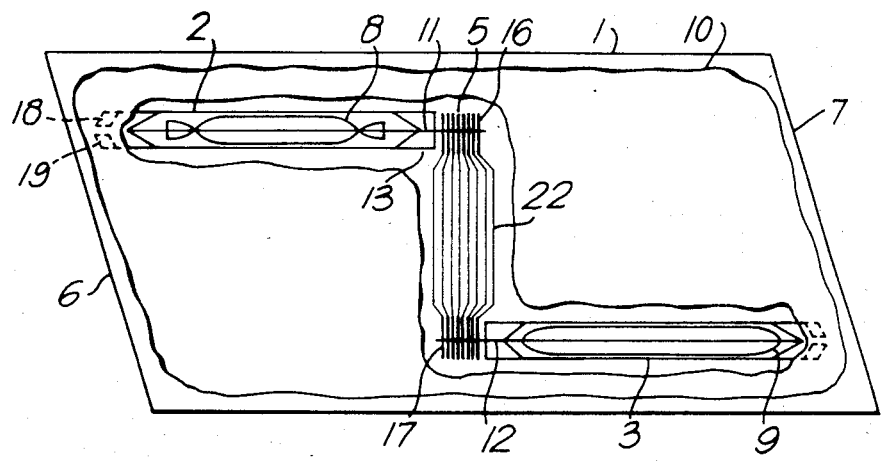

United States Patent [19]

Schofield

[11] Patent Number: 4,567,453
[45] Date of Patent: Jan. 28, 1986

[54] ACOUSTIC SURFACE WAVE DEVICE

[75] Inventor: John Schofield, Coulsdon, England

[73] Assignee: U.S. Philips Corporation, New York, N.Y.

[21] Appl. No.: 532,877

[22] Filed: Sep. 16, 1983

[30] Foreign Application Priority Data

Sep. 20, 1982 [GB] United Kingdom ............... 8226703

[51] Int. Cl.[4] ...................... H03H 9/145; H03H 9/64; H03H 9/42
[52] U.S. Cl. ............................. 333/194; 310/313 D; 333/153; 333/195
[58] Field of Search ................. 333/150–155, 333/193–196; 310/313 R, 313 A, 313 B, 313 C, 313 D; 330/5.5

[56] References Cited

U.S. PATENT DOCUMENTS

| | | | |
|---|---|---|---|
| 3,959,748 | 5/1976 | Subramanian | 333/195 |
| 4,079,342 | 3/1978 | Solie | 333/195 |
| 4,334,167 | 6/1982 | Minagawa et al. | 310/313 R |
| 4,417,221 | 11/1983 | Hunsinger | 333/153 |

FOREIGN PATENT DOCUMENTS 2532646 11/1976 Fed. Rep. of Germany ...... 333/195

Primary Examiner—Marvin L. Nussbaum
Attorney, Agent, or Firm—Robert T. Mayer; Bernard Franzblau

[57] ABSTRACT

An acoustic surface wave device employing an input and an output transducer (2, 3) and a multistrip coupler (5). The input and output tracks (11, 12) are separated to avoid unwanted acoustic energy transfer. As a result, a significant loss can occur from the launching of acoustic energy from the interconnecting conductors of the msc. The interconnecting conductors (22, 32') of the multistrip coupler are spaced differently from the, or the equivalent, wide-aperture beam spacing of conductors (16, 17; 36', 37') in either track of the msc so as not to launch any acoustic surface or bulk waves within the frequency passband. In a forward transfer msc different spacings can alternate, and in a reflective msc the spacing can take the mean of the respective equivalent wide-aperture-beam spacings of the coupler electrodes. In a reflective msc, to overcome spurious responses due to acoustic reflection from one track to the other, especially when single guided mode transducers are employed, the connecting strips (32') are inclined to the perpendicular to the propagation direction.

29 Claims, 6 Drawing Figures

ACOUSTIC SURFACE WAVE DEVICE

The invention relates to an acoustic surface wave device comprising a piezoelectric substrate for propagating a surface acoustic wave at a surface thereof, transducer means for launching surface acoustic wave energy into a first propagation track at said surface and for converting surface acoustic wave energy propagating along a second non-overlapping propagation track into an electrical signal, and a multistrip coupler comprising a first array of electrically conductive strips arranged in said first track and a second array of electrically conductive strips arranged in said second track, each array comprising discrete parallel electrically conductive strips each of which is electrically insulated from the other said discrete conductive strips of that array and is electrically connected by means of a corresponding electrically conductive connecting strip to a respective said discrete conductive strip of the other array. The arrangement is such that surface acoustic wave energy launched by said transducer means along said first track is received by said first array and at least a part of that energy is relaunched as surface acoustic wave energy into said second track so as to be received by said transducer means. Such a device will be referred to herein as an acoustic surface wave device of the kind referred to.

Figure 3:
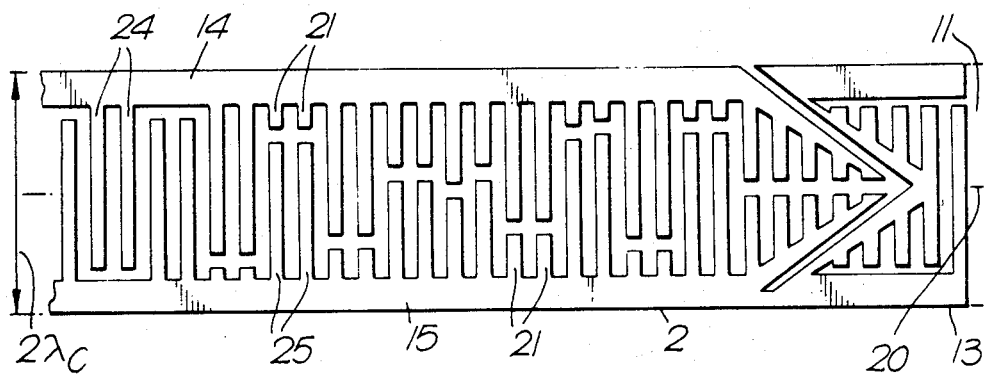

Such an acoustic surface wave device can comprise a filter arrangement as illustrated, for example, in FIG. 3.8 at page 71 of Acoustic Surface Waves edited by A. A. Oliner published 1978 by Springer-Verlag, in which an apodized launching transducer is coupled via a multistrip coupler to an apodized receiving transducer. The use of a multistrip coupler enables unwanted signal transfer via bulk waves, which are also launched by interdigital electrode arrays, to be reduced or effectively removed from the propagation path to the receiver. The multistrip coupler also enables both the launching and the receiving transducers to be apodized if desired to form a symmetrical arrangement.

An acoustic surface wave filter of this kind can be computed which, under ideal conditions, will satisfy a desired pass band response to within given approximations, by techniques employing Fourier synthesis and computer optimisation. Thus computer programs have been devised which will specify the required distribution and intensities of sources along the transducer. In an apodized interdigital array, such sources are realised in practice by the overlap of adjacent electrodes one from each of two overlapping sets of interdigital electrodes, each set being connected to a corresponding one of two opposite bus bars. The strength of each source is a function mainly of the length, at right angles to the acoustic surface wave propagation direction, of said overlap, although end effects and the effects of nearest neighbouring electrodes also have to be taken into account depending on the strength of the source under consideration. The distribution of overlaps along an apodized transducer can conveniently be indicated in a diagrammatic representation by the overlap envelope, which comprises a pair of lines drawn to follow the respective ends of the overlap between adjacent electrodes along the interdigital array.

In some applications it is desirable to make the transducer arrays less than about $10\lambda_c$ wide, where $\lambda_c$ is the surface acoustic wavelength corresponding to the center frequency $f_c$ of the pass-band of the device. When an interdigital array of such a width is employed there is a tendency for the acoustic wave energy response to spread sideways by diffraction making it necessary to space the tracks coupled by the multistrip coupler. When this is attempted and the spacing between the tracks becomes several surface acoustic wavelengths, a considerable amount of acoustic wave energy tends to be launched by the interconnecting strips of the multistrip coupler in the region between the two tracks and therefore is lost to the receiving transducer. This can greatly increase the insertion loss of the device.

It is an object of the invention to provide an improved surface acoustic wave device of the kind referred to in which the insertion loss from this cause can be reduced.

According to the invention there is provided an acoustic surface wave device comprising a piezoelectric substrate for propagating a surface acoustic wave at a surface thereof, transducer means for launching surface acoustic wave energy into a first propagation track at said surface and for converting surface acoustic wave energy propagating along a second non-overlapping propagation track into an electrical signal, and a multistrip coupler comprising a first array of electrically conductive strips arranged in said first track and a second array of electrically conductive strips arranged in said second track, each array comprising discrete parallel electrically conductive strips each of which is electrically insulated from the other said discrete conductive strips of that array and is electrically connected by means of a corresponding electrically conductive connecting strip to a respective said discrete conductive strip of the other array. The surface acoustic wave energy launched by said transducer means along said first track is received by said first array and at least a part of that energy is relaunched as surface acoustic wave energy into said second track so as to be received by said transducer means. The invention is characterised in that the adjacent boundaries of said first and second propagation tracks, as defined by the aperture of the corresponding transducer means, are spaced from one another and the spacing of said electrically conductive connecting strips is made different throughout the major portion of the length of each said connecting strip from the, or the equivalent, wide-aperture-beam spacing of the electrically conductive strips in either array. This spacing is arranged so that the amount of acoustic wave energy launched in the substrate region between said first and second arrays within the desired pass-band of the device is substantially reduced or minimised with respect to the acoustic energy that would be launched if the spacing were equivalent to that employed in either said first or said second array. Preferably the electrically conductive conecting strips are made substantially narrower than the electrically conductive strips forming either array of the multistrip coupler.

The said spacing of the electrically conductive connecting strips is preferably made uniformly the same over substantially the whole length thereof. Each connecting strip can be in the form of one or more rectilinear portions, although transitional connecting portions of minimal length can be provided if necessary at each end to establish an electrical connection to the corresponding electrode strip in the respective track, the corresponding rectilinear portions of respective connecting strips being parallel to one another.

The invention is based on the realisation that in the usual multistrip coupler, the connecting strips which connect elements in the first array with corresponding elements in the second array, normally take the spacing of the conductors of one or other of the arrays, in the usual wide-aperture-beam case, i.e. where the aperture is greater than about $5\lambda_c$, and will therefore act in the same way as the array conductors to launch surface acoustic wave energy in a synchronous manner. However by selecting a spacing for the connecting conductors in the region between the two tracks which is asynchronously related within the desired pass band of the device to any likely acoustic wave energy propagation mode, corresponding energy loss from the connecting strips can be reduced substantially to a minimum. It should be understood that it is not only surface acoustic wave propagation modes that have to be considered because the connecting strips can also couple to other acoustic wave modes, such as bulk waves, which have a propagation velocity close to that of the surface acoustic wave, so that spacings which couple to such bulk waves must also be avoided. One such bulk wave in lithium niobate is the slow shear bulk wave.

An embodiment of a device in accordance with the invention, in which the multistrip coupler is a forward coupler respectively receiving and relaunching surface acoustic wave energy in the same direction along the first and second tracks, is characterised in that the spacing of respective adjacent pairs of conductive connecting strips is greater than 1.1 times or less than 0.9 times the, or the equivalent, wide-aperture-beam spacing of the electrically conductive strips forming either array.

A further embodiment of a device in accordance with the invention, in which the multistrip coupler is a reflective multistrip coupler, is characterised in that the spacing of the conductive connecting strips is approximately the arithmetic mean of the respective, or the respective equivalent, wide-aperture-beam spacings of the active conductive strips forming the first and second arrays.

The invention is further based on the realisation that when a launching and a receiving transducer are coupled by means of a reflective multistrip coupler, surface acoustic wave energy which has spread sideways from the first track, as a result of using a single symmetrical guided mode of propagation or as a result of diffraction in a wide aperture transducer, will tend to be acoustically reflected by the interconnecting conductors of the reflective multistrip coupler and can then be received as an undesired signal by the receiving transducer. This undesired effect can be reduced or overcome by suitably inclining the interconnecting conductors from the perpendicular to the surface acoustic wave propagation direction in either track so that the acoustically reflected wave is directed either away from the second track or towards the second track at such an angle that the proportion of the reflected energy that can propagate along the second track, to be transduced by the receiving transducer, is substantially reduced or minimised.

It should in general be noted in a device in accordance with the invention that, because of the length thereof, the electrically conductive connecting conductors of the multistrip coupler will tend to behave as a wide-aperture-beam device in relation to the launching of surface acoustic wave energy. Therefore in order to achieve an asynchronous launching condition the interconnecting conductor spacing should be related, if possible, to the spacing of active electrodes in either track which are also arranged to transduce a wide-aperture-beam. The invention is, however, equally applicable to devices in which the transducers are arranged to propagate and transduce a single symmetrical guided mode. In such a device the actual spacing of the active electrodes in each track of the coupler will then have to be related to the periodicity of the propagating phase pattern of the guided mode and will be different from the equivalent spacing which would have been used for a wide-aperture beam. To simplify the description and to avoid any ambiguity, the spacing of the interconnecting conductors will always be related herein to the equivalent wide-aperture-beam spacing of the active electrodes of the multistrip coupler when referring to a device using the single symmetrical guided mode.

Figure 2:
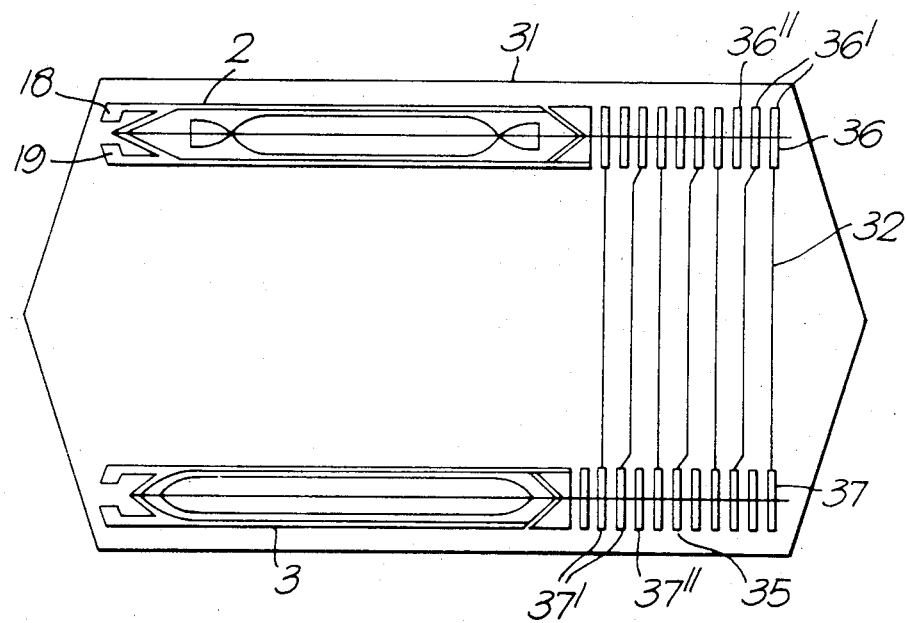
Figure 4:
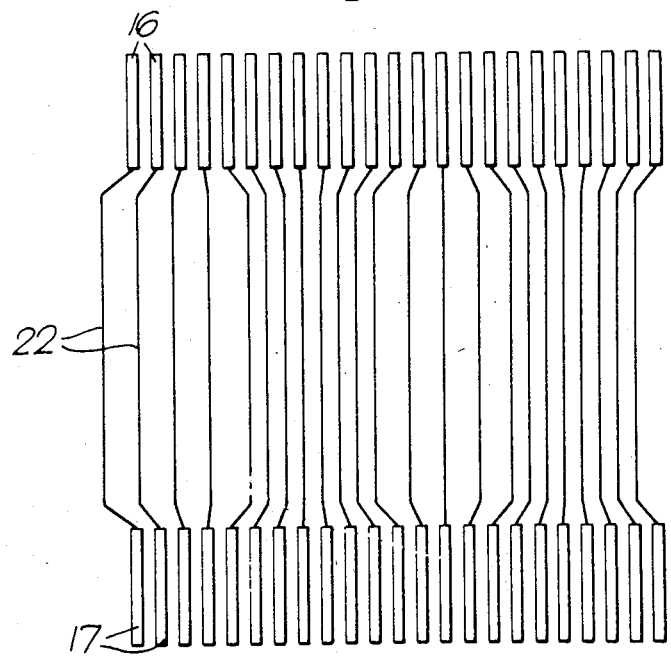
Figure 5:
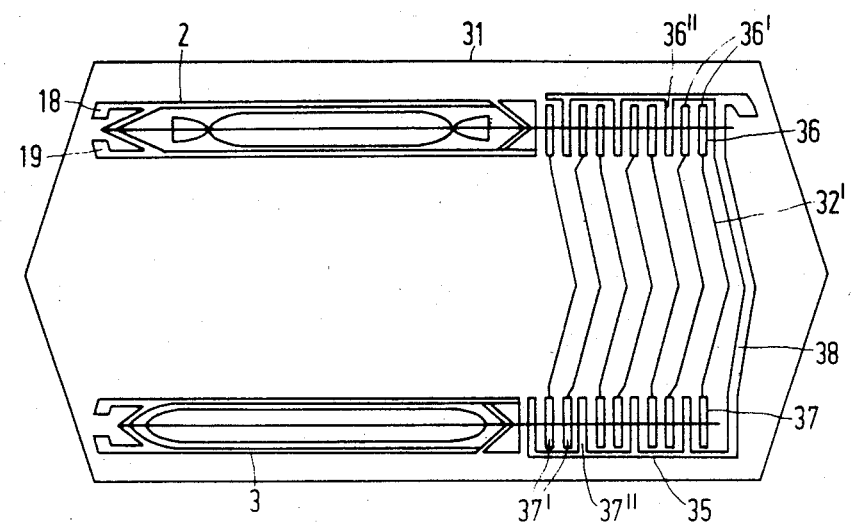
Figure 6:
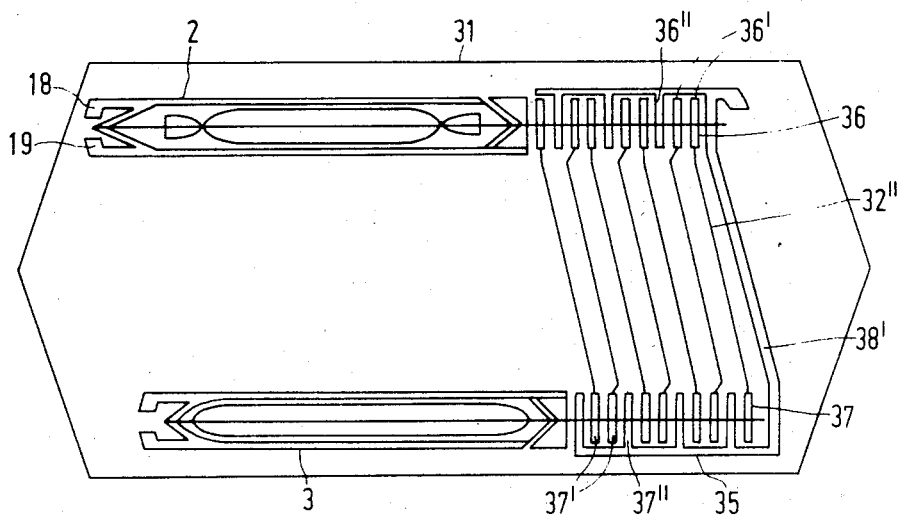

Embodiments of the invention will now be described by way of example, with reference to the accompanying drawings, in which:

FIG. 1 shows an acoustic surface wave filter in accordance with the invention,

FIG. 2 shows a further acoustic surface wave filter in accordance with the invention and using a reflective multistrip coupler, FIG. 3 shows a portion of a transducer array employed in FIG. 2 in enlarged form, FIG. 4 illustrates a part of a transmissive multistrip coupler in accordance with the invention, FIG. 5 shows an improved form of the filter shown in FIG 2, and FIG. 6 shows an alternative to the arrangement of FIG. 5.

In FIG. 1 an acoustic surface wave device in accordance with the invention, in the form of a band-pass filter, comprises a piezoelectric substrate 1 for propagating an acoustic surface wave at a surface thereof, transducer means comprisig an apodized input transducer 2 for launching acoustic wave energy into a first propagation track 11 at said surface, an apodised output transducer 3 for converting acoustic wave energy propagating along a second track 12 into an electric signal, and a multistrip coupler 5 for receiving acoustic wave energy propagating along the first track 11 and relaunching at least part of that energy as acoustic wave energy into the second track 12 in the direction of the output transducer 3. The input and output transducers are both of the interdigital type, the electrical input signal being applied between the two sets of electrodes of the transducer 2 and the electrical output signal being taken off across the two sets of electrodes of the transducer 3. The transducers 2 and 3 are apodized and the overlap envelope of the interdigital electrodes is shown respectively by the lines 8 and 9. Since interdigital transducers are usually bidirectional, the unwanted surface wave energy launched in a direction away from the multistrip coupler 5 is absorbed, at least partially, by damping material 10 applied to the surface between the end of the transducer 2 and the edge 6 and, for correspondingreasons, between the end of the transducer 3 and the edge 7, and to other parts of the surface where undesired acoustic wave energy can propagate. To this point in the description the device corresponds to the device described and illustrated in FIG. 3.8 at page 71 of said book Acoustic Surface Waves edited by A. A. Oliner.

The width of the interdigital transducer arrays 2, 3 can be several wavelengths wide, for example 20. However, in the present example the overall width of each of the interdigital transducer arrays 2 and 3 between the outer boundaries of the corresponding pair of bus bars, e.g. 14 and 15 in transducer 2 shown in part in FIG. 3, measured in a direction at right angles to the acoustic surface wave propagation direction, is so determined in relation to the wavelength $\lambda_c$ at the centre frequency $f_c$ of the pass-band and in relation to the electrode distribution, that each of the transducer arrays 2, 3 functions as an acoustic surface waveguide which will only propagate and transduce a single guided energy mode which is symmetrical about the central propagation axis (20 in FIG. 3) of the array.

The transducer array 2 is shown in part, enlarged, in FIG. 3, and comprises an apodised interdigital array of two sets of electrodes in which the electrodes of each set are connected to a corresponding one of the pair of opposite bus bars 14, 15, having respective terminal connections 18, 19 (FIG. 1). The bus bar 14 is connected to a source of signal and, in order to minimise capacitive breakthrough, the bus bar 15 is connected to signal ground. The respective sets of electrodes and corresponding bus bars can however, if desired, be driven in antiphase by a source of signal voltage, but in that case a further conductive material pattern connected to ground may be required adjacent the bus bar 15 as a screen to reduce direct electrical breakthrough.

The electrodes forming each of the two sets of the apodized interdigital array suitably comprise double electrodes 24, 25, as described in a paper entitled "Applications of double electrodes in acoustic surface wave device design" by T. W. Bristol et al. presented to the Proc. IEEE Ultrasonics Symposium, October 1972, in order to reduce adverse reflection effects from the electrodes. The spaces between the electrodes of a given set not occupied by overlapping portions of electrodes of the other set are filled by dummy electrodes 21, also double, connected to the same bus bars as the electrodes of the given set, as described in Applied Physics Letters, Dec. 1, 1971, Volume 19, Number 11, at pages 456 to 459.

The communicating end 13 of the transducer 2 is arranged as described in U.S. Pat. No. 4,486,724, issued 12/4/84 so that the undesired edge source at the outer boundary of the signal driven end electrode or bus bar will direct acoustic surface waves generated thereby away from the array propagation axis 20.

In forming an interdigital array using double electrodes as in FIG. 3, the periodicity of the double electrodes will be $\lambda/4$ and the width of each electrode will be $\lambda/8$. However, the present array 2 is formed with an overall width such that acoustic surface waves propagate therealong in a single symmetrical guided mode, for example 3.2 $\lambda_c$ on Y-Z lithium niobate. Such a mode is formed, in accordance with waveguide theory, by the superposition of synchronised intersecting acoustic surface wavefronts reflected at or near the outer boundaries. Thus the guided acoustic surface wave mode will propagate along the array with a phase velocity greater than the normal surface wave propagation velocity in a wide array, but the acoustic surface wave energy will only travel along the array at the group velocity of the mode, which will be less than the free propagation velocity. Consequently the electrode size and spacing must correspond to the phase velocity, while the magnitudes of the sources formed by pairs of overlapping double electrodes must be related in the impulse-time domain to the positions of those overlaps with respect to the group velocity of the guided mode.

As shown in FIG. 1, the apodisation of the launching array 2 and of the receiving array 3, indicated by the lines 8 and 9 respectively, are not the same. The array 2 has a main central lobe with a minor half lobe at each end, while the array 3 is provided with only a main lobe. This relates to a particular example of a device and other forms of apodisation patterns can be used as desired. In fact other forms of weighting can be employed or no weighting at all, provided the array will propagate and transduce a single acoustic surface wave guided-energy mode which is symmetrical about the central propagation axis of the array.

It should be noted that the guided energy mode will in fact extend a short distance beyond the outer boundaries of the bus bars so care must be exercised in applying damping medium 10 to the propagation surface of the device to ensure that a sufficient region is kept clear to either side of each transducer.

The multistrip coupler 5 comprises a first array of mutually insulated parallel strip electrodes 16 whose metal to spacing ratio is similar to that of the array 2 and whose width, i.e. the length of the individual electrodes, is the same as that of the array 2 so that the guided wave emerging from the end 13 of the array 2 will continue to propagate through the multistrip coupler 5 along a first track 11. A second array of mutually insulated parallel strip electrodes 17, of the same periodicity and metal to spacing ratio as the electrodes 16, are arranged to define a second track 12 spaced from the first track, preferably by at least $5\lambda_c$, so as to direct acoustic surface wave energy at a second transducer 3 of similar construction and dimensions to those of the transducer array 2.

Each of the electrodes 16 disposed along the first track of the multistrip coupler 5 is connected to a corresponding electrode 17 disposed along the second track by a respective conductive connecting strip 22. In accordance with the invention, the spacing of the connecting strips 22 is made different, throughout the major portion of the length thereof, from the, or the equivalent, wide-aperture-beam spacing of the electrically conductive strips forming the electrodes 16 and 17 to the extent that the amount of acoustic wave energy, i.e. relating to both surface waves and bulk waves, which is launched in the substrate in the region containing the array of connecting strips 22 within the desired pass-band of the device is minimised and is made substantially less than the acoustic wave energy that would be launched if the spacing of the connecting strips were equivalent to that of the electrodes 16 or to that of the electrodes 17. It should be noted that the strips 22 are rectilinear and parallel to one another and that they are connected at each end to a corresponding electrode 16, 17 via a transitional connecting portion of minimal length so that any surface acoustic wave energy launched thereby, and therefore causing loss, is kept to a minimum.

As can be seen from FIG. 1, the connecting strips 22 are spaced by a greater distance than the electrodes 16 or the electrodes 17 throughout the major part of the length of such strip 22. The spacing must be such that the voltage variation induced by the surface wave propagating past the electrodes 16 provides a voltage variation along the distribution of connecting electrodes 22 which is substantially asynchronous, within the desired pass-band of the device, with any surface acoustic wave or bulk wave of the same frequency that can propagate parallel to the propagation tracks 11, 12, in the region occupied by the connecting electrodes 22.

The above description of the spacing of the electrodes 16 and 17 and of the connecting electrodes 22 relates in general terms to the situation present in a device in accordance with the invention and is particularly relevant to the case in which the launching and receiving transducers are conventional wide aperture transducers. It should be noted that when the single symmetrical guided mode transducers 2 and 3 shown in FIG. 1 are employed to launch such a mode into the coupler array and the electrodes 16 are arranged so that this mode is maintained while passing along the first track of the coupler and is regenerated by the electrodes 17 in the second track, the spacing of the electrodes 16 and 17 along the corresponding tracks 11 and 12 must be modified, as discussed above in relation to the transducers 2 and 3, to conform with the phase velocity of the propagating mode. However the spacing of the connecting conductors 22 is assumed herein always to be related to the equivalent wide-aperture-beam conductor spacing for the tracks 11 and 12 because, owing to the length of the conductors 22, namely about 5λ or more, acoustic energy would be launched in the uniform wide-aperture configuration and, in general, not in any of the guided modes, in the intervening space between the first and second tracks.

If a relatively long multistrip coupler 5 were to be used, it could become difficult to accommodate the spaced connecting conductors 22 in the manner shown in FIG. 1. It then may be necessary to alternate a section of wide spacing with a section having a spacing which is rather less than the equivalent to that of the electrodes 16 and 17, as illustrated in FIG. 4. Preferably the respective relative spacings should be greater than 1.1 times and less than 0.9 times the equivalent wide-aperture-beam spacing of the electrodes 16, 17.

In general, the change in pitch of the connecting coductors 22 relative to that of the electrodes 16, 17 of the transmissive multistrip coupler may in some cases be quite small. For example if there is no slow shear bulk wave with a velocity close to that of the surface wave in the propagation direction, it may be sufficient to increase the spacing so that the connecting conductor array is longer by one wide-aperture-beam wavelength, $\lambda_c$, than the equivalent wide-aperture-beam length of the two arrays of electrodes 16 and 17, thus causing cancellation of the progressive wave with respect to any surface wave propagation.

A further acoustic surface wave device in accordance with the invention is illustrated in FIG. 2 which shows an arrangement which is more compact and would use less substrate material. The launching and receiving transducers formed on a piezoelectric substrate 31 comprise apodised interdigital arrays 2 and 3 identical to those shown in FIG. 1. In this device a reflecting multistrip coupler 35 is employed comprising a first and second array of mutually insulated parallel strip electrodes 36 and 37, respectively, arranged in a corresponding propagation track for acoustic surface wave energy propagating in the arrays 2 and 3, respectively. The electrodes 36, 37 in each array are spaced with a period of $\lambda_c/3$ and are divided into two groups, those 36', 37' which are each connected to an electrode 37', 36' in the other array via a thin interconnecting conductor 32, and those 36", 37" which are not so connected, i.e. they are dummy electrodes, but are preferably connected together by respective bus bars (not shown in FIG. 2) which can be connected to ground potential with respect to signal frequencies. The interconnections 32 are such that a pair of electrodes 36', 37' in one array which lie on either side of a dummy electrode 36", 37", are connected to respective electrodes 37', 36', of an immediately adjacent pair of electrodes in the other array. In this way a path difference of $\lambda_c$ is introduced in the reflected signal path via adjacent driven electrodes 37', reinforcing the reflected acoustic wave energy so as to direct it at the receiving array 3. As mentioned before $\lambda_c$ in respect of the spacing of the electrodes 36', 36", 37', 37", must be the wavelength $\lambda_c'$ of the phase pattern at the centre frequency of the pass-band in the case of the single symmetrical guided mode.

In accordance with the invention the interconnecting conductors 32 are spaced by approximately the arithmetical mean of the respective spacings or equivalent wide-aperture-beam spacings, over the major part of their lengths, of the active electrodes 36', 37' in the arrays, namely the mean of $\lambda_c/3$ and $2\lambda_c/3$, so that neither a forward nor a reflected surface or bulk acoustic wave is launched by the connecting electrodes 32.

As in the case of the device shown in FIG. 1, that part of the surface of the substrate 31 which is not used to propagate acoustic surface wave energy from the array 2 to the array 3 via the reflective multistrip coupler 35 would be coated with damping material (not shown).

As has been mentioned, the single symmetrical guided mode, in which surface acoustic wave energy is propagated along the transducers 2 and 3, extends laterally beyond the outer boundaries of the metallisation pattern of the transducers, i.e. beyond the bus bars. It has been found that in the case of the reflective coupler arrangement shown in FIG. 2, there is a tendency for a significant amount of this surface wave energy to be acoustically reflected by the connecting strips 32 so as to form an undesired reflected signal component in the output of the receiving transducer 3. The tendency for the connecting strips 32 to reflect surface wave energy acoustically in or near the pass band is enhanced by the fact that the spacing of the strips is approximately $\lambda_c/2$.

FIG. 5 illustrates a modification of the device shown in FIG. 2 in which the effects of such acoustic reflections can be reduced. The electrically conducting connecting strips 32' are inclined to the perpendicular to the surface acoustic wave propagation direction in either track by an amount sufficient to cause surface acoustic wave energy from the first track, after acoustic reflection by the connecting strips 32', to be directed either away from the second track or towards the second track at such an angle that the proportion of the reflected energy that can propagate along the second track, to be transduced by the receiving transducer 3, is substantially reduced or minimised relative to the arrangement of FIG. 2. For this purpose, in FIG. 5, the connecting conductors 32' are arranged in a chevron pattern, and this enables the transducers 2 and 3 to be located in the same positions as in FIG. 2 and for the device to occupy the same area of substrate material.

An alternative modification of FIG. 2 is illustrated in FIG. 6 in which the connecting conductors 32" are rectilinear and are inclined to the perpendicular to the surface acoustic wave propagation direction in the two tracks as described in relation to the conductors 32' in FIG. 5. In both FIGS. 5 and 6 the dummy electrodes 36", 37" are all connected together by a common bus bar connection 38 or 38' respectively which can, if desired, be connected to ground.

The reflective multistrip coupler can be formed by any convenient alternative arrangement such as for example that disclosed in a paper by M. Feldmann and J. Henaff entitled "A new multistrip acoustic surface wave filter" printed in the Proceedings of the IEEE Ultrasonics Symposium 1974 at pages 157–160, provided that the interconnecting conductors are made narrower than the electrodes which are interconnected thereby and are, in accordance with the invention, spaced by approximately the arithmetic mean of the spacings, or of the equivalent wide-aperture-beam spacing in the case of the single symmetrical guided mode, in the two electrode arrays of the coupler, preferably throughout substantially their entire length, such that neither a forward nor a reflected surface or bulk acoustic wave is launched by the interconnecting electrodes within the desired pass-band of the device.

While the invention has been described with reference to embodiments using monomode guided surface wave transducers, it is not restricted thereto and is equally applicable for use with conventional transducers when it is desired to separate the first and second propagation tracks as defined by the apertures of the corresponding transducers, by a significant distance, for example not less than $5\lambda_c$. Furthermore, when conventional wide-aperture apodised transducers are employed, the surface acoustic wave components associated with short overlap electrode pairs, used to provide small sources in an apodised array, can suffer a significant amount of diffraction and therefore a sideways spreading of the surface acoustic wave energy propagating in the first track. This spread of energy would tend, in a manner similar to that hereinbefore described in relation to the single symmetrical guided mode, to be acoustically reflected by the interconnecting conductors of a reflective multistrip coupler with the possibility of contributing an undesired signal component to the output of the device, as with the device shown in FIG. 2. Thus the modifications and improvements of FIGS. 5 and 6 are equally applicable to a wide aperture device.

I claim:

1. An acoustic surface wave device comprising a piezoelectric substrate for propagating a surface acoustic wave at a surface thereof, transducer means for launching surface acoustic wave energy into a first propagation track at said surface and for converting surface acoustic wave energy propagating along a second non-overlapping propagation track into an electrical signal, and a multistrip coupler comprising a first array of electrically conductive strips arranged in said first track and a second array of electrically conductive strips arranged in said second track, each array comprising discrete parallel electrically conductive strips electrically insulated from one another, said discrete conductive strips of one array being electrically connected by means of corresponding electrically conductive connecting strips to respective said discrete conductive strips of the other array, surface acoustic wave energy launched by said transducer means along said first track being received by said first array and at least a part of that energy being relaunched as surface acoustic wave energy into said second track so as to be received by said transducer means, characterized in that adjacent boundaries of said first and second propagation tracks, as defined by the aperture of the corresponding transducer means, are spaced from one another, and the spacing of said electrically conductive connecting strips is different throughout the major portion of the length of each said connecting strip from the wide-aperture-beam spacing of the electrically conductive strips in either array such that the amount of acoustic wave energy launched in the substrate region between said first and second arrays within the desired pass-band of the device is substantially reduced or minimized with respect to the acoustic energy that would be launched if the spacing were equivalent to that in either said first or said second array.

2. An acoustic surface wave device as claimed in claim 1, wherein said electrically conductive connecting strips are substantially narrower than said electrically conductive strips forming either said array.

3. An acoustic surface wave device as claimed in claim 2 wherein the spacing between any pair of adjacent electrically conductive connecting strips is uniformly the same over substantially the whole length thereof.

4. An acoustic surface wave device as claimed in claim 2 wherein the multistrip coupler is a reflective multistrip coupler, and wherein the spacing of said conductive connecting strips is approximately the arithmetic mean of the respective wide-aperture-beam spacings of the active conductive strips forming said first and second arrays.

5. An acoustic surface wave device as claimed in claim 2 wherein the transducer means comprises respective launching and receiving transducers each comprising at least one interdigital electrode array of two overlapping sets of electrodes, each set being connected to one of a pair of opposite bus bars, said transducers being arranged respectively to launch and to receive surface acoustic wave energy in said first and second tracks, and wherein each said interdigital array has an overall width between parallel outer boundaries of said opposite bus bars such that the array propagates and transduces a single symmetrical guided mode of surface acoustic wave energy, the spacing between said first and second tracks being at least $5\lambda_c$ where $\lambda_c$ is the surface acoustic wavelength corresponding to the center frequency $f_c$ of the pass-band of the device.

6. An acoustic surface wave device as claimed in claim 1 wherein said spacing of each said electrically conductive connecting strip from the next adjacent strip, is uniformly the same over substantially the whole length thereof.

7. An acoustic surface wave device as claimed in claim 6, wherein each said electrically conductive connecting strip comprises at least one rectilinear portion and a transitional connecting portion of minimal length at each end, corrresponding rectilinear portions of respective adjacent connecting strips being parallel to one another.

8. An acoustic surface wave device as claimed in claim 6 wherein the multistrip coupler respectively receives and relaunches surface acoustic wave energy in the same direction along said first and second tracks, and wherein the spacing of respective adjacent pairs of said conductive connecting strips is greater than 1.1 times or less than 0.9 times the wide-aperture-beam spacing of said electrically conductive strips forming either said array.

9. An acoustic surface wave device as claimed in claim 6 wherein the multistrip coupler is a reflective multistrip coupler, and said first and second propagation tracks are substantially parallel to one another, and wherein each said electrically conductive connecting strip is substantially rectilinear and is inclined to the perpendicular to the surface acoustic wave propagation direction in either track by an amount sufficient to reduce or minimize that component of surface acoustic wave energy passed via said second track to said transducer means which comprises surface acoustic wave energy directed by said transducer means along said first track and acoustically reflected by said connecting strips.

10. An acoustic surface wave device as claimed in claim 1 wherein the multistrip coupler respectively receives and relaunches surface acoustic wave energy in the same direction along said first and second tracks, characterized in that the spacing of respective adjacent pairs of said conductive connecting strips is greater than 1.1 times or less than 0.9 times the wide-aperture-beam spacing of said electrically conductive strips forming either said array.

11. An acoustic surface wave device as claimed in claim 1 wherein the multistrip coupler is a reflective multistrip coupler, the spacing of said conductive connecting strips being approximately the arithmetic mean of the respective wide-aperture-beam spacings of the active conductive strips forming said first and second arrays.

12. An acoustic surface wave device as claimed in claim 11 wherein: the multistrip coupler is a reflective multistrip coupler and said first and second propagation tracks are substantially parallel to one another, each said electrically conductive connecting strip comprises at least one rectilinear element inclined to the perpendicular to the surface acoustic wave propagation direction in either track by an amount sufficient to reduce that component of surface acoustic wave energy passed via said second track to said transducer means which comprises surface acoustic wave energy directed by said transducer means along said first track and acoustically reflected by said connecting strips.

13. An acoustic surface wave device as claimed in claim 1 wherein the multistrip coupler is a reflective multistrip coupler and said first and second propagation tracks are substantially parallel to one another, characterised in that each said electrically conductive connecting strip comprises at least one rectilinear element inclined to the perpendicular to the surface acoustic wave propagation direction in either track by an amount sufficient to reduce or minimise that component of surface acoustic wave energy passed via said second track to said transducer means which comprises surface acoustic wave energy directed by said transducer means along said first track and acoustically reflected by said connecting strips.

14. An acoustic surface wave device as claimed in claim 13 wherein said electrically conductive connecting strips each comprise two rectilinear elements disposed in the form of a chevron.

15. An acoustic surface wave device as claimed in claim 1 wherein said transducer means comprises respective launching and receiving transducers each comprising at least one interdigital electrode array of two overlapping sets of electrodes, each set being connected to one of a pair of opposite bus bars, said transducers being arranged respectively to launch and to receive surface acoustic wave energy in said first and second tracks, characterised in that each said interdigital array has an overall width between parallel outer boundaries of said opposite bus bars, such that the array can only propagate and transduce a single symmetrical guided mode of surface acoustic wave energy, the spacing between said first and second tracks being least $5\lambda_c$, where $\lambda_c$ is the surface acoustic wavelength corresponding to the centre frequency $f_c$ of the pass-band of the device.

16. An acoustic surface wave device as claimed in claim 1 wherein the multistrip coupler is a reflective multistrip coupler, said transducer means comprises respective launching and receiving transducers each comprising at least one interdigital electrode array of two overlapping sets of electrodes, each set being connected to one of a pair of opposite bus bars, said transducers being arranged respectively to launch and to receive surface acoustic wave energy in said first and second tracks, each said interdigital array having an overall width between parallel outer boundaries of said opposite bus bars such that the array only propagates and transducers a single symmetrical guided mode of surface acoustic wave energy, the spacing between said first and second tracks being at least $5\lambda_c$, where $\lambda_c$ is the surface acoustic wavelength corresponding to the center frequency $f_c$ of the pass-band of the device.

17. An acoustic surface wave device comprising a piezoelectric substrate for propagating a surface acoustic wave at a surface thereof, a first transducer for launching surface acoustic wave energy into a first propagation track, a second transducer for converting surface acoustic wave energy propagating along a second propagation track into an electrical signal, and a multistrip coupler comprising a first array of parallel electrically conductive strips arranged in said first track and a second array of parallel electrically conductive strips arranged in said second track, a plurality of electrically conductive connecting strips connecting conductive strips of the first array to respective conductive strips of the second array so that surface acoustic wave energy launched by the first transducer along the first track is received by said first array and at least a part of said energy is relaunched as surface acoustic wave energy along the second track so as to be received by the second transducer, characterized in that adjacent boundaries of said first and second propagation tracks are defined by the aperture of the corresponding transducer and are spaced from one another, and the spacing of said electrically conductive connecting strips is different throughout the major portion of the length of each said connecting strip from the equivalent wide-aperture beam spacing of the electrically conductive strips in either array such that the acoustic wave energy launched in the substrate region between said first and second arrays within the desired pass-band of the device is substantially reduced with respect to the acoustic energy that would be launched if the spacing were equivalent to that in either said first or second array.

18. An acoustic surface wave device as claimed in claim 17 wherein the first transducer has an apodization pattern that is different from the apodization pattern of the second transducer.

19. An acoustic surface wave device as claimed in claim 17 wherein the spacing between said first and second tracks is at least $5\lambda_c$ where $\lambda_c$ is the surface acoustic wavelength corresponding to the center frequency $f_c$ of the pass-band of the device and the transducer arrays are at most $10\lambda_c$ wide.

20. An acoustic surface wave device as claimed in claim 17 wherein the spacing of respective adjacent pairs of said conductive connecting strips is greater than 1.1 times or is less than 0.9 times the equivalent wide-aperture beam spacing of said electrically conductive strips forming either said array.

21. An acoustic surface wave device as claimed in claim 17 wherein the multistrip coupler is a reflective multistrip coupler, and wherein the spacing of said conductive connecting strips is approximately the arithmetic mean of the respective equivalent wide-aperture beam spacings of the active conductive strips forming said first and second arrays.

22. An acoustic surface wave device as claimed in claim 17 wherein the spacing between some of the connecting strips is greater than the spacing between conductors of the first or second array and the spacing between other ones of the connecting strips is less than the spacing between conductors of the first or second array.

23. An acoustic surface wave device as claimed in claim 17 wherein the connecting strips are at least $5\lambda_c$ long, where $\lambda_c$ is the surface acoustic wavelength corresponding to the center frequency $f_c$ of the frequency pass-band of the device.

24. An acoustic surface wave device comprising a piezoelectric substrate for propagating a surface acoustic wave at a surface thereof, an input transducer for launching surface acoustic wave energy into a first propagation track, an output transducer for converting surface acoustic wave energy propagating along a second propagation track parallel to and spaced from the first track into an electrical signal, said input transducer comprising an interdigital electrode array of two interleaved sets of elongate electrodes with a central propagation axis perpendicular to said electrodes and an apodization pattern symmetrical about said central propagation axis, and a multistrip coupler comprising a first array of parallel electrically conductive strips arranged within said first track and a second array of parallel electrically conductive strips arranged within said second track, and a plurality of electrically conductive connecting strips connecting conductive strips of the first array to respective conductive strips of the second array, wherein adjacent boundaries of said first and second propagation tracks are defined by the aperture of the corresponding transducer and are spaced from one another, the spacing of said electrically conductive connecting strips being different throughout the major portion of the length of each said connecting strip from the spacing of the electrically conductive strips in either array so as to reduce acoustic wave energy launched by the connecting strips in the substrate region between said first and second arrays.

25. An acoustic surface wave device as claimed in claim 24 wherein the input and output transducers each comprise a pair of parallel oppositely arranged bus bars that essentially define the outer boundaries of the energy propagation track of the respective input or output transducer.

26. An acoustic surface wave device as claimed in claim 24 wherein the output transducer comprises an interdigital electrode array of two interleaved sets of elongate electrodes wherein the outer boundaries of the first and second energy propagation tracks are defined by the input and output transducers independent of the multistrip coupler.

27. An acoustic surface wave device as claimed in claim 26 wherein the physical outer limits of said first and second arrays of the multistrip coupler are coextensive with the outer limits of the active regions of the input and output transducers, respectively.

28. An acoustic surface wave device as claimed in claim 27 wherein the connecting strips between said first and second arrays are at least $5\lambda_c$ long, where $\lambda_c$ is the surface acoustic wavelength corresponding to a center frequency $f_c$ of the frequency pass-band of the device.

29. An acoustic surface wave device as claimed in claim 24 wherein said electrically conductive connecting strips comprise linear elements inclined to the perpendicular to the surface acoustic wave propagation direction in either track.

* * * * *